(12) United States Patent
Ball

(10) Patent No.: US 8,392,674 B1
(45) Date of Patent: Mar. 5, 2013

(54) EMBEDDED MEMORY DATA TRANSFORMATION CIRCUITRY

(75) Inventor: James L. Ball, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 575 days.

(21) Appl. No.: 11/490,747

(22) Filed: Jul. 20, 2006

(51) Int. Cl.
*G06F 12/00* (2006.01)

(52) U.S. Cl. ............... 711/159; 711/154; 710/1; 710/2; 710/23; 710/36; 710/49; 710/66; 710/68

(58) Field of Classification Search ............ 711/159, 711/154; 710/1, 2, 23, 36, 49, 66, 68
See application file for complete search history.

(56) References Cited

U.S. PATENT DOCUMENTS 5,721,957 A * 2/1998 Huang et al. .............. 710/66
7,219,214 B2 * 5/2007 Ford et al. ................ 712/225

OTHER PUBLICATIONS

Palem et al., "Design Space Optimization of Embedded Memory Systems via Data Remapping," 2002, Center for Research on Embedded Systems and Technology, School of Electrical and Computer Engineering, Georgia Institute of Technology, pp. 1-10.

* cited by examiner

*Primary Examiner* — Midys Rojas
(74) *Attorney, Agent, or Firm* — Kwan & Olynick LLP

(57) ABSTRACT

Methods and apparatus are provided for allowing a component such as a processor on a programmable chip efficient access to properly transformed data an embedded memory. Circuitry is provided with the read data port associated with an embedded memory. The circuitry can be used to perform both static bit width configuration of an embedded memory as well as perform data transformation or data alignment of embedded memory read data. The circuitry can allow efficient data transformations including selection of half words and bytes as well as perform sign extension and zero extension of memory read data.

18 Claims, 6 Drawing Sheets

Programmable Chip 301

Processor Core 311

Embedded Memory 321

Bit Width Configuration Circuitry And Data Transformation Circuitry 323

US 8,392,674 B1

EMBEDDED MEMORY DATA TRANSFORMATION CIRCUITRY

BACKGROUND OF THE INVENTION

1. Field of the Invention

The present invention relates to embedded memory on programmable chips. In one example, the present invention relates to methods and apparatus for providing static configuration as well as data transformation or data alignment circuitry with embedded memory.

2. Description of Related Art

Programmable chips often include embedded memory for use as cache and tightly coupled memory for processors and other components. The embedded memory is typically statically configurable and provides data in a particular format to components such as processors. For example, data read from an embedded memory may be required to have a particular alignment. Data held in embedded memory may or may not be properly aligned and may or may not have the appropriate sign extension or fill bits. However, conventional mechanisms for transformation data from an embedded memory to a component such as processor on a programmable chip are limited.

For example, mechanisms for transforming data may be inefficient or use an excessive amount of logic. Consequently, there are continued efforts to provide mechanisms that overcome at least some of the drawbacks noted above.

SUMMARY OF THE INVENTION

Methods and apparatus are provided for allowing a component such as a processor on a programmable chip efficient access to properly transformed data from an embedded memory. Data transformation circuitry is provided with the read data port associated with an embedded memory. The data transformation circuitry can be used to perform both static bit width configuration of an embedded memory as well as perform data transformation or data alignment of embedded memory read data. The circuitry can allow efficient data transformations including selection of half words and bytes and also allow sign extension and zero extension of memory read data.

In one embodiment, a programmable chip is provided. The programmable chip includes a processor core and a memory block embedded on a programmable chip. The memory block is connected to the processor core and the memory block includes hardwired circuitry operable to perform a data transformation on read data requested by the processor core from the memory block.

In another embodiment, a programmable chip system is provided. The programmable chip system includes a processor core, a memory block, and multiple peripheral components and interfaces. The processor core is included on the programmable chip system. The memory block is connected to the processor core and includes hardwired circuitry operable to perform a data transformation on read data requested by the processor core from the memory block. The plurality of peripheral components and interfaces are connected to the processor core over an interconnection fabric included on the programmable chips system.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
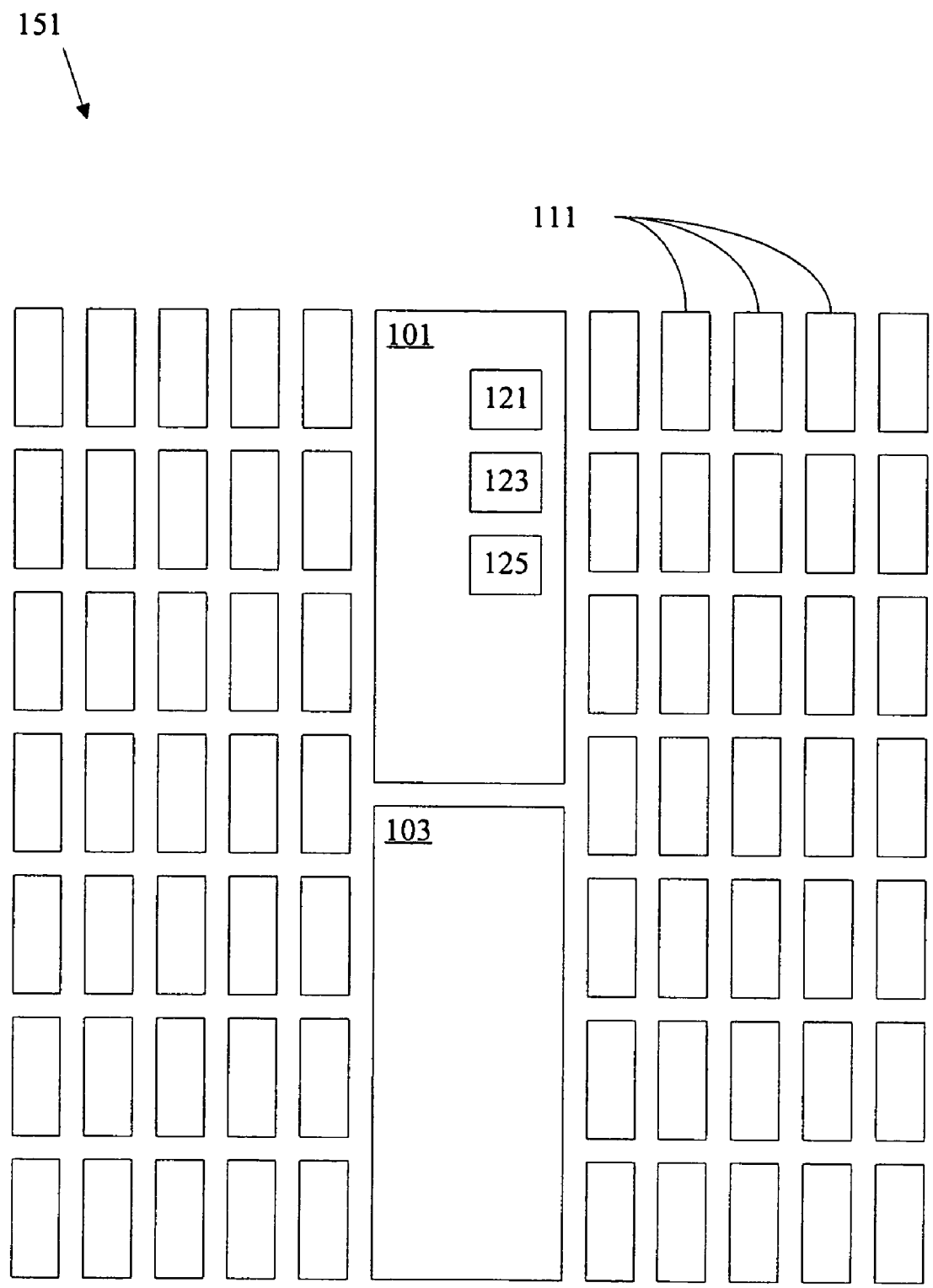
FIG. 1 is a diagrammatic representation of a programmable chip.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of programmable chips, programmable chip memory, and multiplexers. However, it should be noted that the techniques of the present invention can be applied to a variety of devices and logic blocks. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Furthermore, techniques and mechanisms of the present invention will sometimes be described in singular form for clarity. However, it should be noted that some embodiments include multiple iterations of a technique or multiple instantiations of a mechanism unless noted otherwise. For example, a processor is used in a variety of contexts. However, it will be appreciated that multiple processors can also be used while remaining within the scope of the present invention unless otherwise noted.

Programmable chips include embedded memory blocks for use as data cache memory and tightly coupled memory. Embedded memory on a programmable chip is inexpensive relative to the cost of memory on a device such as an Application Specification Integrated Circuit (ASIC). Consequently, it is often desirable to use ample memory alongside hard and soft logic cores as well as circuitry implemented using logic elements. In some instances, embedded memory blocks are used with a processor core as well as other peripherals components and interfaces to build a system on a programmable chip.

In order to use embedded memory effectively, logic is used to modify the data read from a memory block. For example, logic implemented using logic elements may be required to align and sign extend or zero extend read data coming from the memory block. Logic used to modify data read from an embedded memory is referred to herein as data transformation logic or circuitry. Many processors read and write bytes, half words, and words. Using circuitry on ASICs does not significantly decrease performance. However, using logic elements to perform data transformations on a programmable chip can decrease processor performance and use valuable logic resources.

Consequently, the techniques of the present invention provide efficient hard coded logic for modifying memory block reads. According to various embodiments, the hard coded logic supplements existing embedded memory block static bit width configuration circuitry that allows static configuration for particular bit width operation. For example, hard coded logic can supplement existing circuitry that allows static configuration of a memory block for 9-bit, 18-bit, or 36-bit operation. In some examples, existing multiplexers used for static configuration of operation of a particular bit width can also be used to perform alignment, sign extension, and zero extension of read data or other types of data transformations.

FIG. 1 is a diagrammatic representation showing one example of a programmable chip that can use the techniques of the present invention. Any device such as a Field Programmable Gate Array (FPGA) or a Programmable Logic Device (PLD) that is configurable using a hardware descriptor language (HDL) such as Verilog or VHDL is referred to herein as a programmable chip. A programmable chip 151 includes logic elements 111, embedded memory 103, as well as other resources such as hard coded logic blocks 101. The programmable chip uses different types of resources that can be interchangeably used in different allocations to implement a programmable chip. In one example, the programmable chip uses a mix of logic elements, embedded memory, and hard-coded logic for implementing each of the various components on the programmable chip.

According to various embodiments, embedded memory 103 is a 32-bit embedded memory. The embedded memory 103 includes static bit width configuration circuitry that allows the embedded memory blocks to operate in 9-bit, 18-bit, or 36-bit mode. Each memory is typically a single ported memory, although multiple ported memories are contemplated.

The logic resources are logic elements (LEs) 111, logic array blocks (LABs) or logic cells. Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

Logic elements can also be used to implement soft processors as well as other components such as hardware accelerators, peripheral devices, and peripheral interfaces. Peripheral devices and peripheral interfaces are herein referred to as components. In some embodiments, a system on a programmable chip can be implemented on the programmable chip 151. The programmable chip system components are connected using an interconnection fabric. Any mechanism or logic for connecting components in a system is referred to herein as an interconnection fabric. In one example, the interconnection fabric is a bus. In another example, the interconnection fabric is a slave side arbitration fabric that associates slave components with individual arbiters to allow a first master component to access a first slave component at the same time a second master component is accessing a second slave component.

In some examples, the hard coded logic blocks 101 are DSP blocks that can efficiently implement multiplication, multiply-accumulate (MAC) and multiply-add functions. In one example, the hard coded logic block 101 includes a multiplier 121, an adder 123, and an accumulator 125. The multipliers can be configured to feed an adder or an accumulator.

In many implementations, read data transformation circuitry is implemented using logic elements 111. Embedded processor cores and other components that use embedded memories for data caches and tightly-coupled memories currently have a 2-cycle load/use penalty because the data transformation stage, such as a load-alignment stage, is constructed from logic elements 111. If the data transformation logic such as load alignment circuitry were incorporated in the data cache, the processor would have a single cycle load/use penalty. Many of the multiplexers required already exist in memory blocks and are used for static configuration of memory for operation at a particular bit width. Any hard coded logic for static configuration of an embedded memory for particular bit width operation is referred to herein as static embedded memory bit width configuration circuitry. The techniques of the present invention contemplate modifying multiplexers associated with static bit width configuration circuitry and providing dynamic control signals to allow implementation of hard coded data transformation circuitry. The data transformation circuitry can be used to perform data alignment operations.

Figure 2:
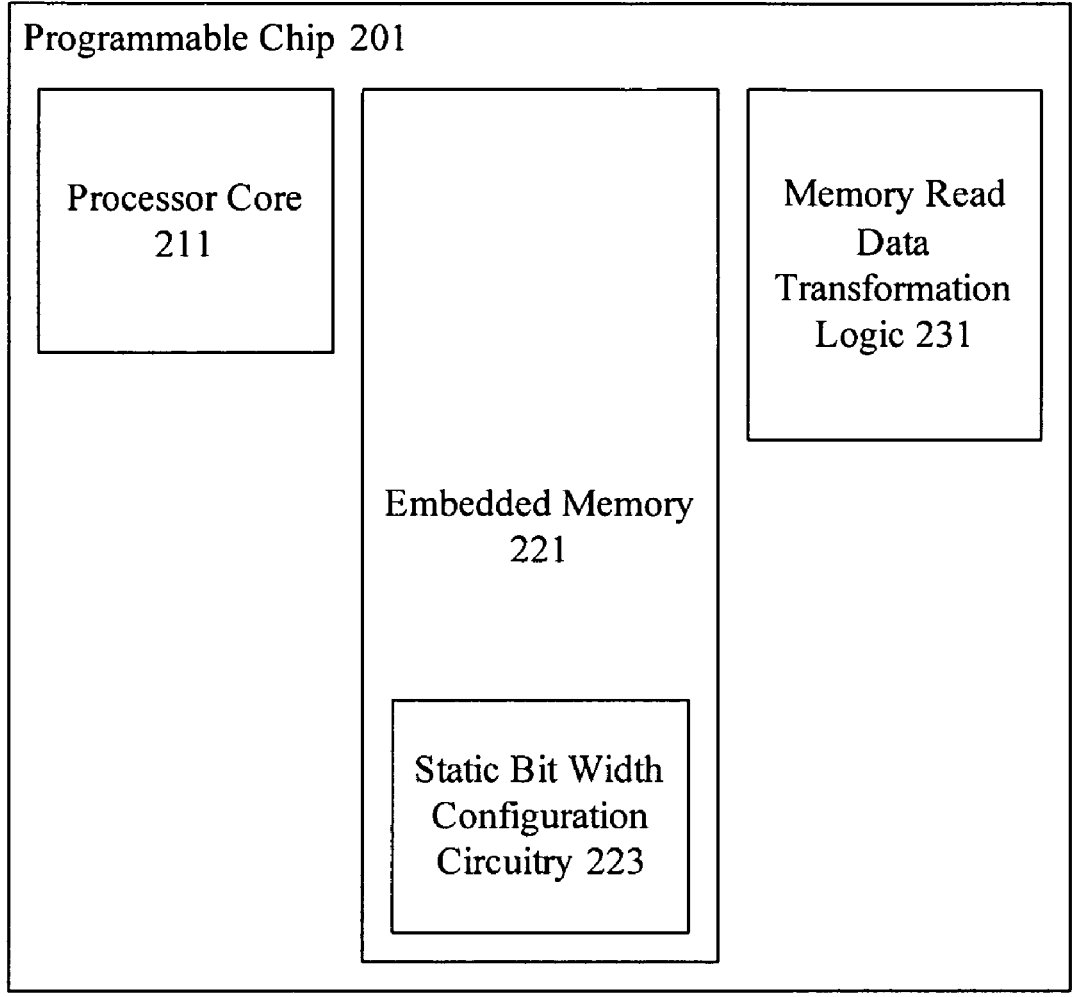
FIG. 2 is a diagrammatic representation showing load alignment extension and data transformation logic elements.

FIG. 2 is a diagrammatic representation showing one example of a programmable chip having an embedded memory. The programmable chip 201 includes a processor core 211. According to various embodiments, the processor core 211 is a soft core available from an intellectual property core library and the processor core 211 is configured using logic elements. In other examples, the processor core 211 is a hard-wired processor core included on the programmable chip 201. The processor core 211 is one of a variety of components that can access an embedded memory 211. A hardware accelerator or an Ethernet controller are other components that can use embedded memory 211. Embedded memory 211 can hold either memory aligned data or memory unaligned data. Memory alignment entails placing data at memory addresses that are evenly divisible by particular numbers. For example a 32-bit processor may require an integer data value to reside at an address divisible by 4.

Embedded memory 221 includes static bit width configuration circuitry 223. The static bit width configuration circuitry 223 includes static control lines that configure the embedded memory to operate in a particular mode, such as 8-bit, 16-bit, or 32-bit operation. However, no dynamic mechanisms are provided to allow the embedded memory 221 to transform data read by a processor or another component.

Many processors read data aligned in a particular way. For example, many 32-bit processors read and write bytes, half words, and words. Consequently, embedded memory 221 uses soft logic implemented read data transformation logic 231 to transform data provided on the embedded memory read port. For example, read data transformation logic 231 aligns and sign/zero-extends read data coming from the embedded memory 221. The read data transformation logic 231 can perform a variety of data transformations. In one example, it passes 32-bit data unchanged. In another example, it selects either the high half word or low half word of the memory data, and either sign extends the selected half word or zero extends it to 32-bits. In yet another example, it selects one of the four bytes of the memory read data, and either sign extends the selected byte or zero extends it to 32-bits.

Figure 3:
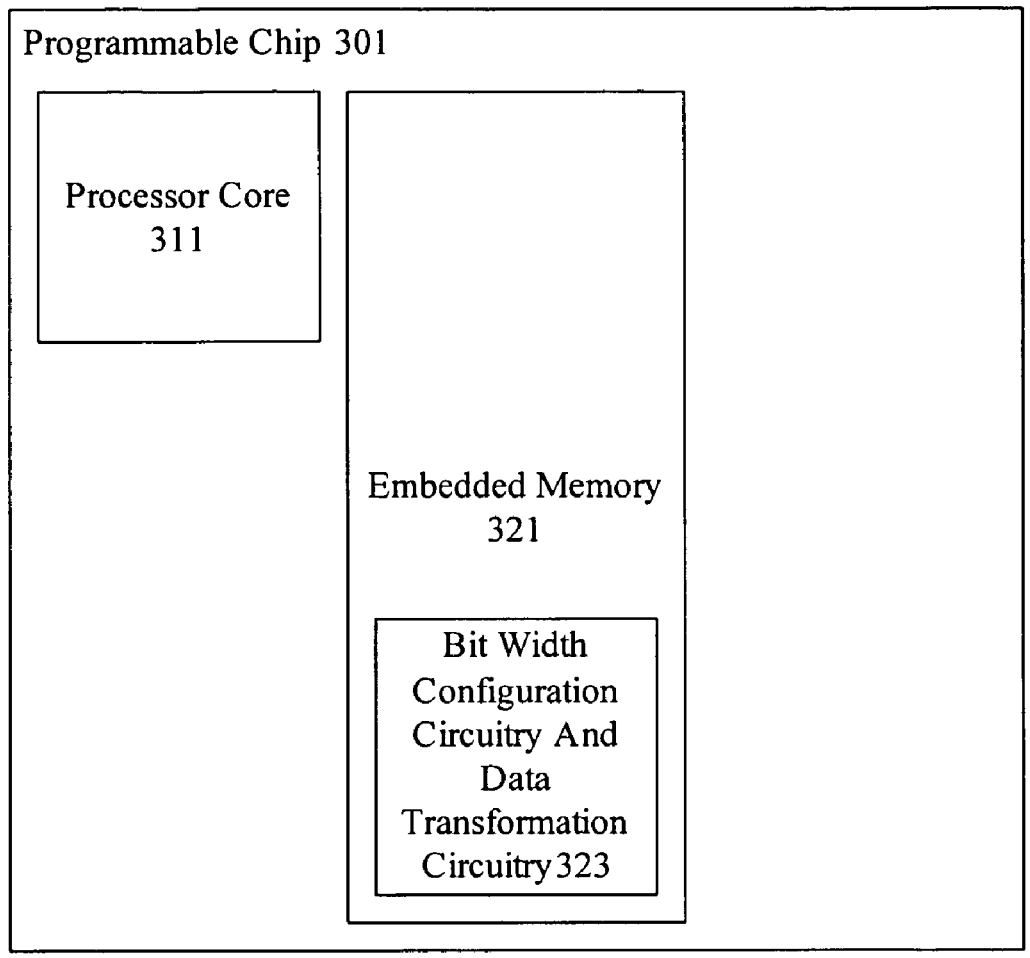
FIG. 3 is a diagrammatic representation showing load alignment and data transformation logic included in embedded memory.

FIG. 3 is a diagrammatic representation showing another example of a programmable chip having an embedded memory. The programmable chip 301 includes a processor core 311. According to various embodiments, the processor core 311 is a soft core available from an intellectual property core library and the processor core 311 is configured using logic elements. In other examples, the processor core 311 is a hard-wired processor core included on the programmable chip 301. The processor core 311 is one of a variety of components that can access an embedded memory 321. A hardware accelerator or an Ethernet controller are other components that can use embedded memory 321. Embedded memory 321 can hold either memory aligned data or memory unaligned data. Memory alignment entails placing data at memory addresses that are evenly divisible by particular numbers. For example a 32-bit processor may require an integer data value to reside at an address divisible by 4.

The embedded memory 321 uses static bit width configuration circuitry 323. The static bit width configuration circuitry 323 includes static control lines that configure the embedded memory to operate in a particular mode, such as 8-bit, 16-bit, or 32-bit operation. However, typically dynamic mechanisms are provided to allow the embedded memory 321 to transform data read by a processor or another component.

Many processors read data aligned in a particular way. For example, many 32-bit processors read and write bytes, half words, and words. The techniques and mechanisms of the present invention recognize that when embedded memory 321 uses soft logic implemented read data transformation logic to transform data provided on the embedded memory read port, there is a multiple cycle load/use penalty because the load-alignment state is constructed from logic elements. If the load alignment circuitry were incorporated in the data cache, the processor would have only a single cycle load/use penalty. Many of the multiplexers required for data transformation already exist in many embedded memory blocks. The techniques and mechanisms of the present invention provide that the control signals for these multiplexers are dynamic instead of static.

Consequently, bit width configuration circuitry and data transformation circuitry 323 are both hard-wired with an embedded memory 321. The combined bit width configuration circuitry and data transformation circuitry 323 configures the embedded memory for operation at a particular bit width and dynamically aligns and sign/zero-extends read data coming from the embedded memory 321. The bit width configuration circuitry and data transformation circuitry 323 can perform a variety of data transformations. In one example, it passes 32-bit data unchanged. In another example, it selects either the high half word or low half word of the memory data, and either sign extends the selected half word or zero extends it to 32-bits. In yet another example, it selects one of the four bytes of the memory read data, and either sign extends the selected byte or zero extends it to 32-bits.

Figure 4:
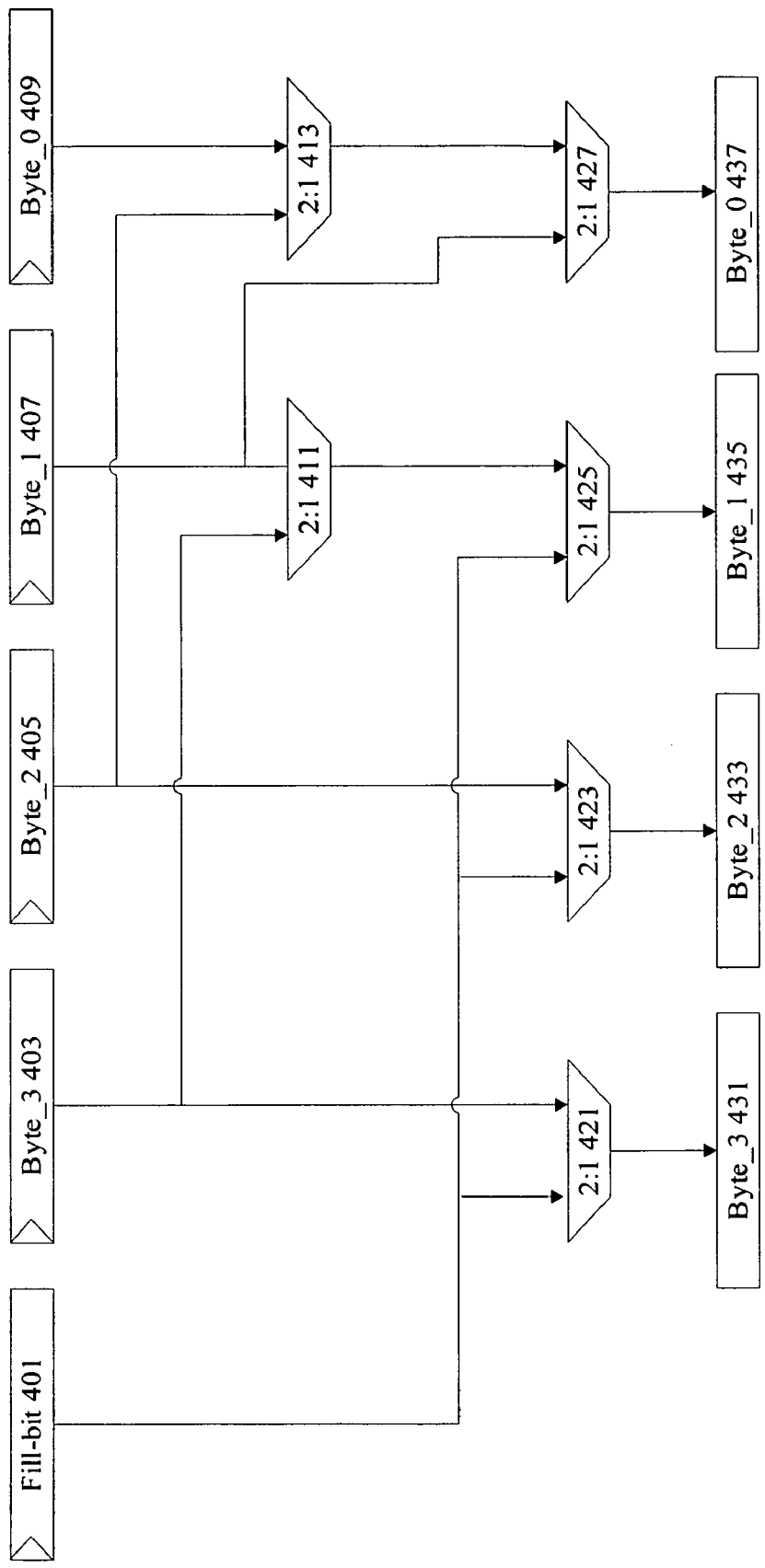
FIG. 4 is a diagrammatic representation showing dynamic load alignment circuitry.

FIG. 4 is a diagrammatic representation showing data transformation circuitry. According to various embodiments, data transformation circuitry is combined with bit width configuration circuitry and can also be referred to as load alignment circuitry. The data transformation circuitry accepts a 32-bit word held in byte_3 403, byte_2 405, byte_1 407, and byte_0 409 and aligns and fills the data as needed to provide output byte_3 431, output byte_2 433, output byte_1 435, and output byte_0 437. According to various embodiments, there is one instance of the bit width configuration circuitry and data transformation circuitry in the data cache. The input of the data transformation circuitry is connected to the read data output of an embedded memory inside the data cache. The output of the data transformation circuitry is connected to the processor operand forwarding multiplexers. The path from the read data output to the forward multiplexers is typically a critical path and can limit the maximum frequency of a processor Consequently, data transformation logic or load alignment logic is moved into the hard-wired logic of an embedded memory to increase the speed of the critical path. According to various embodiments, the data cache requires read data in unaligned and aligned versions, so the embedded memory is statically configured to have extra outputs for the aligned read data in addition to the normal unaligned read data. The embedded memory also has extra control signals to control the data transformation circuitry. The control signals are used to control multiplexers 411, 413, 421, 423, 425, and 427. The signals are registered with other embedded memory inputs such as the read address.

According to various embodiments, six 2:1 multiplexers 411, 413, 421, 423, 425, and 427 in the data transformation logic each have a one-bit control signal. To function as a load aligner, multiplexers 411 and 413 share one control signal and the multiplexers 421 and 423 share another control signal. Multiplexer 425 and multiplexer 427 each have their own control signals and fill-bit 401 is associated with a fifth control signal. This reduces the number of needed control signals. According to various embodiments, the five control signals are created by logical element based logic and driven to the memory just like other inputs signals to the memory. In some examples, the control signals are generated in a particular manner. The fill bit 401 is set to zero for unsigned loads. For signed byte loads, the fill bit 401 is set to the sign bit of byte 0, 1, 2, or 3. For signed halfword loads, the fill bit is set to the sign bit of byte 0 or byte 2. The fill bit is not required for word loads.

For byte loads, a right shift by 0, 8, 16, or 24 bits is accomplished followed by replacing bytes 1, 2, and 3 with the fill bit. A right shift by 24 is accomplished by performing a right shift by 16 and then a right shift by 8. For halfword loads, a right shift by 0 or 16 bits is accomplished followed by replacing bytes 2 and 3 with the fill bit.

Figure 5:
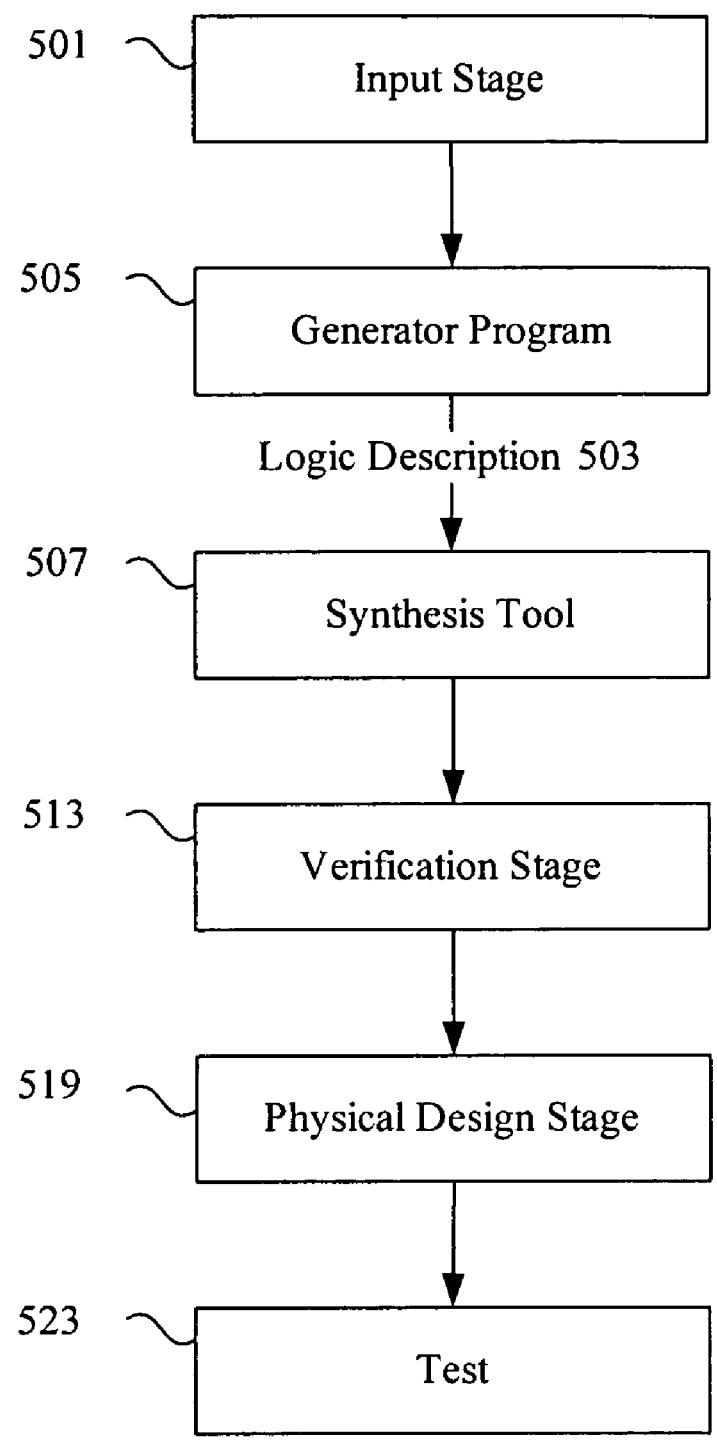
FIG. 5 is a diagrammatic representation showing a technique for implementing the programmable chip.

FIG. 5 is a diagrammatic representation showing implementation of an electronic device that can use according to various embodiments. An input stage 501 receives selection information typically from a user for logic such as a processor core as well as other components to be implemented on an electronic device. In one example, the input received is in the form of a high-level language program. A generator program 505 creates a logic description and provides the logic description along with other customized logic to any of a variety of synthesis tools, place and route programs, and logic configuration tools to allow a logic description to be implemented on an electronic device.

In one example, an input stage 501 often allows selection and parameterization of components to be used on an electronic device. The input stage 501 also allows configuration of hard coded logic. In some examples, components provided to an input stage include intellectual property functions, megafunctions, and intellectual property cores. The input stage 501 may be a graphical user interface using wizards for allowing efficient or convenient entry of information. The input stage may also be a text interface or a program reading a data file such as a spreadsheet, database table, or schematic to acquire selection information. The input stage 501 produces an output containing information about the various modules selected.

In typical implementations, the generator program 505 can identify the selections and generate a logic description with information for implementing the various modules. The generator program 505 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 505 identifies pointers and provides ports for each pointer. One tool with generator program capabilities is System on a Programmable Chip (SOPC) Builder available from Altera Corporation of San Jose, Calif. The generator program 505 also provides information to a synthesis tool 507 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 509.

As will be appreciated by one of skill in the art, the input stage 501, generator program 505, and synthesis tool 507 can be separate programs. The interface between the separate programs can be a database file, a log, or simply messages transmitted between the programs. For example, instead of writing a file to storage, the input stage 501 can send messages directly to the generator program 505 to allow the generator program to create a logic description. Similarly, the generator program can provide information directly to the synthesis tool instead of writing HDL files. Similarly, input stage 501, generator program 505, and synthesis tool 507 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 507.

A synthesis tool 507 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 513 typically follows the synthesis stage 507. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 513, the synthesized netlist file can be provided to physical design tools 519 including place and route and configuration tools. A place and route tool typically locates logic cells on specific logic elements of a target hardware device and connects wires between the inputs and outputs of the various logic elements in accordance with logic required to implement an electronic design. The device can also be physically tested at 523.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 501, the generator program 505, the synthesis tool 507, the verification tools 513, and physical design tools 519 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 6:
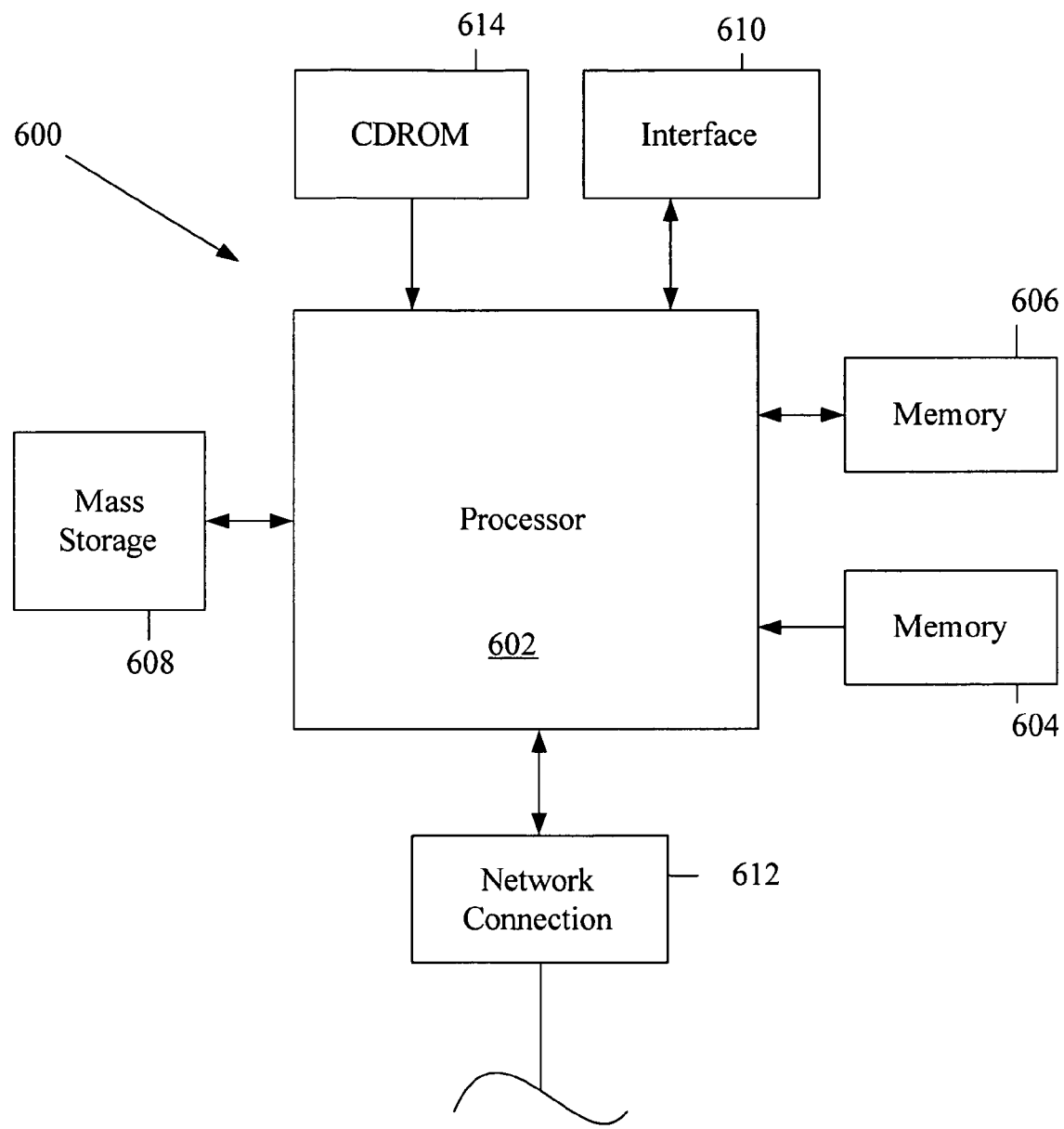
FIG. 6 is a diagrammatic representation depicting a computer system.

FIG. 6 is a diagrammatic representation showing a typical computer system that can be used to implement a programmable chip having bus arbitration with priority encoding and fairness. The computer system 600 includes any number of processors 602 (also referred to as central processing units, or CPUs) that are coupled to devices including memory 606 (typically a random access memory, or "RAM"), memory 604 (typically a read only memory, or "ROM"). The processors 602 can be configured to generate a test sequences for any designated processor. As is well known in the art, memory 604 acts to transfer data and instructions uni-directionally to the CPU and memory 606 is used typically to transfer data and instructions in a bi-directional manner.

Both of these memory devices may include any suitable type of the computer-readable media described above. A mass storage device 608 is also coupled bi-directionally to CPU 602 and provides additional data storage capacity and may include any of the computer-readable media described above. The mass storage device 608 may be used to store programs, data and the like and is typically a secondary storage medium such as a hard disk that is slower than memory. The mass storage device 608 can be used to hold a library or database of prepackaged logic or intellectual property functions, as well as information on generating particular configurations. It will be appreciated that the information retained within the mass storage device 608, may, in appropriate cases, be incorporated in standard fashion as part of memory 606 as virtual memory. A specific mass storage device such as a CD-ROM 614 may also pass data uni-directionally to the CPU.

CPU 602 is also coupled to an interface 610 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 602 optionally may be coupled to a computer or telecommunications network using a network connection as shown generally at 612. With such a network connection, it is contemplated that the CPU might receive information from the network, or might output information to the network in the course of performing the above-described method steps. It should be noted that the system 600 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 608 or 614 and executed on CPU 608 in conjunction with primary memory 606.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the to present invention may be employed with a variety of primary and secondary components and should not be restricted to the ones mentioned above. Although shared I/O lines have been described in the context of a memory controller and a simultaneous multiple primary component switch fabric, shared I/O lines can be used in a system without a memory controller and/or without a simultaneous multiple primary component switch fabric. It is therefore intended that the invention be interpreted to include all variations and equivalents that fall within the true spirit and scope of the present invention.

What is claimed is:

1. A device comprising:
    an embedded memory block comprising a load alignment and data transformation circuit that is arranged to change such embedded memory block's operation from a first bit width to a second bit width, wherein said load alignment and data transformation circuit is further arranged to dynamically place data from a first memory address evenly divisible by a first number to a second memory address evenly divisible by a second number, and wherein said load alignment and data transformation circuit is further arranged to dynamically sign extend the data that is placed from the first memory address to the second memory address.

2. The device of claim 1, further comprising a plurality of logic elements, wherein said embedded memory block is other than logic elements of the plurality of logic elements, wherein one of the logic elements includes a lookup table.

3. The device of claim 1, further comprising a processor coupled with the embedded memory block, wherein said embedded memory block is operable to perform the placement of the data based on an operation of the processor.

4. The device of claim 1, further comprising:
    a processor;
    a read data output port coupled with the processor and with the load alignment and data transformation circuit; and
    a plurality of processor operand forwarding multiplexers coupled with the read data output port via a path, wherein the path is operable to change a maximum frequency of the processor.

5. The device of claim 1, wherein the load alignment and data transformation circuit comprises a plurality of multiplexers operable to perform the placement of the data, the sign extension, and the change in the operation.

6. The device of claim 1, wherein said load alignment and data transformation circuit comprises:
    a first register comprising a fill bit of the data stored in the first memory address;
    a second register comprising a first byte of the data stored in the first memory address;
    a third register comprising a second byte of the data stored in the first memory address;
    a first multiplexer operable to output the first byte or the second byte to the second memory address; and
    a second multiplexer operable to output the second byte or the fill hit to the second memory address.

7. The device of claim 6, wherein the load alignment and data transformation circuit further comprise:
    a fourth register comprising a third byte of the data stored in the first memory address;
    a fifth register comprising a fourth byte of the data stored in the first memory address;
    a third multiplexer operable to output the fill bit or the third byte to the second memory address; and
    a fourth multiplexer operable to output the fill bit or the fourth byte to the second memory address.

8. The device of claim 7, wherein the load alignment and data transformation circuit further comprises:
    a fifth multiplexer operable to output the first byte or the third byte to the first multiplexer, wherein the first multiplexer is operable to output the first byte, the second byte, or the third byte to the second memory address; and
    a sixth multiplexer operable to output the second byte or the fourth byte to the second multiplexer, wherein the second multiplexer is operable to output the second byte, the fourth byte, or the fill hit to the second memory address.

9. The device of claim 8, wherein the third and fourth multiplexers are operable to share a first control signal, wherein the fifth and sixth multiplexers are operable to share a second control signal, wherein the first multiplexer is operable to be controlled via a third control signal, and the second multiplexer is operable to be controlled via a fourth control signal.

10. A method comprising:
    receiving a change in operation of an embedded memory block from a first bit width to a second bit width, wherein the change in operation is received by a load alignment and data transformation circuit of the embedded memory block;

the load alignment and data transformation circuit dynamically placing data from a first memory address evenly divisible by a first number to a second memory address evenly divisible by a second number; and the load alignment and data transformation circuit of the embedded memory block dynamically sign extending the data that is placed from the first memory block address to the second memory address.

11. The method of claim 10, further comprising performing a logic function using one or more logic elements, wherein the one or more logic elements is other than the embedded memory block.

12. The method of claim 10, further comprising performing the placement of the data based on an operation of a processor.

13. The method of claim 10, further comprising changing a maximum frequency of a processor coupled with the embedded memory block by performing said placing and said sign extending.

14. The method of claim 10, further comprising changing the operation of the embedded memory block from time first bit width to the second bit width, wherein said changing, placing, sign extending are performed by multiplexing the data.

15. The method of claim 10, wherein said placing and said sign extending are performed by the load, alignment and data transformation circuit of the embedded memory block by:
 receiving a fill bit from a first register;
 receiving a first byte from a second register;
 receiving a second byte from a third register;
 in a first multiplexer of the load alignment and data transformation circuit, multiplexing the first and second bytes to output the first byte or the second byte; and
 in a second multiplexer of the load alignment and data transformation circuit, multiplexing the second byte and the fill bit to output the second byte or the fill bit.

16. The method of claim 15, further comprising:
 receiving a third byte from a fourth register;
 receiving a fourth byte from a fifth register;
 in a third multiplexer of the load alignment and data transformation circuit multiplexing the fill bit and the third byte to output the fill bit or the third byte; and
 in a fourth multiplexer of the data transform circuit and the load alignment circuit, multiplexing the fill bit and the fourth byte to output the fill bit or the fourth byte.

17. The method of claim 16, further comprising:
 in a fifth multiplexer of the load alignment and data transformation circuit, multiplexing the first and third bytes to output the first byte or third byte to the first multiplexer;
 outputting the first byte, the second byte, or the third byte in response to said multiplexing the first and third bytes;
 in a sixth multiplexer of the load alignment and data transformation circuit, multiplexing the second and fourth bytes to output the second byte or fourth byte to the second multiplexer; and
 outputting the second byte, the fourth byte, or the fill bit in response to said multiplexing the second and fourth bytes.

18. The method of claim 17, further comprising:
 receiving a first control signal to share between the third and fourth multiplexers;
 receiving a second control signal to share between the fifth and sixth multiplexers;
 receiving a third control signal to control the first multiplexer; and
 receiving a fourth control signal to control the second multiplexer.

* * * * *